United States Patent
Haba

(10) Patent No.: US 10,622,291 B2
(45) Date of Patent: Apr. 14, 2020

(54) SSI POP

(71) Applicant: Invensas Corporation, San Jose, CA (US)

(72) Inventor: Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 72 days.

(21) Appl. No.: 15/710,110

(22) Filed: Sep. 20, 2017

(65) Prior Publication Data

US 2018/0068930 A1 Mar. 8, 2018

Related U.S. Application Data

(62) Division of application No. 14/958,190, filed on Dec. 3, 2015, now Pat. No. 9,773,723.

(Continued)

(51) Int. Cl.
*H01L 23/02* (2006.01)
*H01L 23/48* (2006.01)
(Continued)

(52) U.S. Cl.
CPC .......... *H01L 23/498* (2013.01); *H01L 21/486* (2013.01); *H01L 21/4846* (2013.01);
(Continued)

(58) Field of Classification Search
CPC ............. H01L 21/4846; H01L 21/4853; H01L 21/486; H01L 21/56; H01L 21/563;
(Continued)

(56) References Cited

U.S. PATENT DOCUMENTS 5,847,936 A  12/1998  Forehand et al.
6,064,114 A   5/2000  Higgins, III
(Continued)

FOREIGN PATENT DOCUMENTS

DE   19904258 A1   12/1999
WO   2013172814 A1   11/2013
WO   2014066153 A1    5/2014

OTHER PUBLICATIONS

International Search Report and Written Opinion for Application No. PCT/US2014/018057 dated May 8, 2014.
(Continued)

*Primary Examiner* — Kimberly N Rizkallah
*Assistant Examiner* — Dilinh P Nguyen
(74) *Attorney, Agent, or Firm* — Lerner, David, Littenberg, Krumholz & Mentlik, LLP

(57) ABSTRACT

An assembly can include a first microelectronic package and a circuit structure comprising a plurality of dielectric layers and electrically conductive features thereon. The first package can include a substrate having a plurality of first contacts at a first or second surface thereof and a plurality of second contacts at the first surface thereof, and a first microelectronic element having a plurality of element contacts at a front surface thereof. The first contacts can be electrically coupled with the element contacts of the first microelectronic element. The electrically conductive features of the first circuit structure can include a plurality of bumps at the first surface of the circuit structure facing the second contacts of the substrate and joined thereto, a plurality of circuit structure contacts at a second surface of the circuit structure, and a plurality of traces coupling at least some of the bumps with the circuit structure contacts.

8 Claims, 3 Drawing Sheets

Related U.S. Application Data

(60) Provisional application No. 62/159,136, filed on May 8, 2015.

(51) Int. Cl.
*H01L 23/52* (2006.01)
*H01L 23/28* (2006.01)
*H01L 23/498* (2006.01)
*H01L 21/48* (2006.01)
*H01L 23/00* (2006.01)
*H01L 21/78* (2006.01)
*H01L 25/10* (2006.01)
*H01L 21/56* (2006.01)
*H01L 21/683* (2006.01)
*H01L 23/31* (2006.01)
*H01L 23/367* (2006.01)
*H01L 25/065* (2006.01)
*H01L 25/16* (2006.01)
*H01L 25/18* (2006.01)
*H01L 23/04* (2006.01)
*H01L 25/00* (2006.01)

(52) U.S. Cl.
CPC ......... *H01L 21/4853* (2013.01); *H01L 21/56* (2013.01); *H01L 21/563* (2013.01); *H01L 21/6835* (2013.01); *H01L 21/78* (2013.01); *H01L 23/04* (2013.01); *H01L 23/3121* (2013.01); *H01L 23/3135* (2013.01); *H01L 23/3142* (2013.01); *H01L 23/3675* (2013.01); *H01L 23/49811* (2013.01); *H01L 23/49816* (2013.01); *H01L 23/49822* (2013.01); *H01L 23/49827* (2013.01); *H01L 23/49838* (2013.01); *H01L 24/17* (2013.01); *H01L 24/81* (2013.01); *H01L 24/97* (2013.01); *H01L 25/0652* (2013.01); *H01L 25/105* (2013.01); *H01L 25/16* (2013.01); *H01L 25/18* (2013.01); *H01L 24/13* (2013.01); *H01L 24/16* (2013.01); *H01L 24/32* (2013.01); *H01L 25/0655* (2013.01); *H01L 25/50* (2013.01); *H01L 2221/68345* (2013.01); *H01L 2221/68359* (2013.01); *H01L 2221/68381* (2013.01); *H01L 2224/1134* (2013.01); *H01L 2224/133* (2013.01); *H01L 2224/1329* (2013.01); *H01L 2224/13294* (2013.01); *H01L 2224/16113* (2013.01); *H01L 2224/16227* (2013.01); *H01L 2224/32225* (2013.01); *H01L 2224/73204* (2013.01); *H01L 2224/8188* (2013.01); *H01L 2224/81192* (2013.01); *H01L 2224/81444* (2013.01); *H01L 2224/81447* (2013.01); *H01L 2224/81455* (2013.01); *H01L 2224/81862* (2013.01); *H01L 2224/97* (2013.01); *H01L 2225/0652* (2013.01); *H01L 2225/06517* (2013.01); *H01L 2225/06548* (2013.01); *H01L 2225/06572* (2013.01); *H01L 2225/06589* (2013.01); *H01L 2225/1058* (2013.01); *H01L 2924/1427* (2013.01); *H01L 2924/15192* (2013.01); *H01L 2924/15311* (2013.01); *H01L 2924/19041* (2013.01); *H01L 2924/19102* (2013.01)

(58) Field of Classification Search
CPC ..... H01L 21/6835; H01L 21/78; H01L 23/04; H01L 23/3121; H01L 23/3135; H01L 23/3142; H01L 23/3675; H01L 23/49811; H01L 23/49816; H01L 23/49822; H01L 23/49827; H01L 23/49838; H01L 24/17; H01L 24/81; H01L 25/0652; H01L 25/105; H01L 25/16; H01L 25/18
USPC .......................................... 257/686, 777, 787
See application file for complete search history.

(56) References Cited

U.S. PATENT DOCUMENTS

| | | |
|---|---|---|
| 6,150,724 A | 11/2000 | Wenzel et al. |
| 6,285,079 B1 | 9/2001 | Kunikiyo |
| 6,391,220 B1 | 5/2002 | Zhang et al. |
| 6,610,934 B2 | 8/2003 | Yamaguchi et al. |
| 6,660,945 B2 | 12/2003 | Boyko et al. |
| 6,711,813 B1 | 3/2004 | Beyne et al. |
| 6,747,350 B1 | 6/2004 | Lin et al. |
| 6,789,034 B2 | 9/2004 | Freed |
| 6,879,034 B1 | 4/2005 | Yang et al. |
| 7,084,487 B1 | 8/2006 | Conn |
| 7,193,311 B2 | 3/2007 | Ogawa et al. |
| 7,235,477 B2 | 6/2007 | Ogawa |
| 7,439,615 B2 * | 10/2008 | Ruckerbauer ............ G11C 5/02 257/700 |
| 7,491,895 B2 | 2/2009 | Usui et al. |
| 7,791,199 B2 | 9/2010 | Grinman et al. |
| 7,838,417 B2 | 11/2010 | Lopez |
| 7,882,628 B2 | 2/2011 | Muthukumar et al. |
| 7,902,661 B2 | 3/2011 | Smeys et al. |
| 8,105,875 B1 | 1/2012 | Hu et al. |
| 8,125,065 B2 | 2/2012 | Lee |
| 8,198,724 B1 | 6/2012 | Wu et al. |
| 8,486,758 B2 | 7/2013 | Oganesian et al. |
| 8,623,753 B1 | 1/2014 | Yoshida et al. |
| 8,952,516 B2 | 2/2015 | Zohni et al. |
| 9,024,205 B2 | 5/2015 | Uzoh |
| 9,257,396 B2 | 2/2016 | Uzoh |
| 9,437,536 B1 | 9/2016 | Wang et al. |
| 9,570,410 B1 | 2/2017 | Chang et al. |
| 9,721,878 B2 * | 8/2017 | Cheah ................... H01L 21/568 |
| 2002/0045293 A1 | 4/2002 | Tsunoi |
| 2002/0079591 A1 | 6/2002 | Sakiyama et al. |
| 2004/0080036 A1 | 4/2004 | Chang et al. |
| 2004/0264837 A1 | 12/2004 | Ogawa |
| 2005/0067680 A1 | 3/2005 | Boon et al. |
| 2005/0232728 A1 * | 10/2005 | Rice .................... H01L 21/4853 414/217 |
| 2005/0260794 A1 | 11/2005 | Lo et al. |
| 2006/0033210 A1 | 2/2006 | Chauhan et al. |
| 2009/0072383 A1 | 3/2009 | Nakagoshi |
| 2011/0126408 A1 | 6/2011 | Antesberger et al. |
| 2011/0127664 A1 | 6/2011 | Antesberger et al. |
| 2011/0133333 A1 | 6/2011 | Kwon et al. |
| 2011/0133342 A1 | 6/2011 | Arai |
| 2012/0133001 A1 | 5/2012 | Tkaczyk et al. |
| 2012/0139094 A1 | 6/2012 | Haba et al. |
| 2012/0319295 A1 | 12/2012 | Chi et al. |
| 2013/0075889 A1 | 3/2013 | Pagaila et al. |
| 2013/0083583 A1 | 4/2013 | Crisp et al. |
| 2013/0093087 A1 | 4/2013 | Chau et al. |
| 2013/0127054 A1 | 5/2013 | Muthukumar et al. |
| 2013/0203240 A1 | 8/2013 | Reed et al. |
| 2013/0264704 A1 | 10/2013 | Pendse |
| 2013/0313012 A1 | 11/2013 | Yang et al. |
| 2014/0070423 A1 | 3/2014 | Woychik et al. |
| 2014/0077362 A1 * | 3/2014 | Lin ........................ H01L 22/14 257/737 |
| 2014/0159247 A1 | 6/2014 | Lyne et al. |
| 2014/0217617 A1 | 8/2014 | Haba et al. |
| 2014/0231984 A1 | 8/2014 | Chen |
| 2014/0240938 A1 | 8/2014 | Newman et al. |
| 2014/0312490 A1 | 10/2014 | Yang et al. |
| 2015/0235991 A1 | 8/2015 | Gu et al. |
| 2015/0255361 A1 | 9/2015 | Lee et al. |
| 2015/0259194 A1 | 9/2015 | Lin et al. |
| 2015/0327367 A1 | 11/2015 | Shen et al. |
| 2015/0348940 A1 | 12/2015 | Woychik et al. |
| 2016/0172317 A1 | 6/2016 | Tsai et al. |

(56) References Cited

U.S. PATENT DOCUMENTS

2016/0190098 A1 6/2016 Chen et al.
2016/0300817 A1 10/2016 Do et al.
2016/0329267 A1 11/2016 Huang et al.

OTHER PUBLICATIONS

International Search Report and Written Opinion for Application No. PCT/US2014/067496 dated Feb. 18, 2015.
International Search Report and Written Opinion for Application No. PCT/US2016/031207 dated Jul. 21, 2016.
International Search Report and Written Opinion for Application No. PCT/US2016/031259 dated Jul. 21, 2016.
U.S. Appl. No. 62/159,136, filed May 8, 2015.

\* cited by examiner

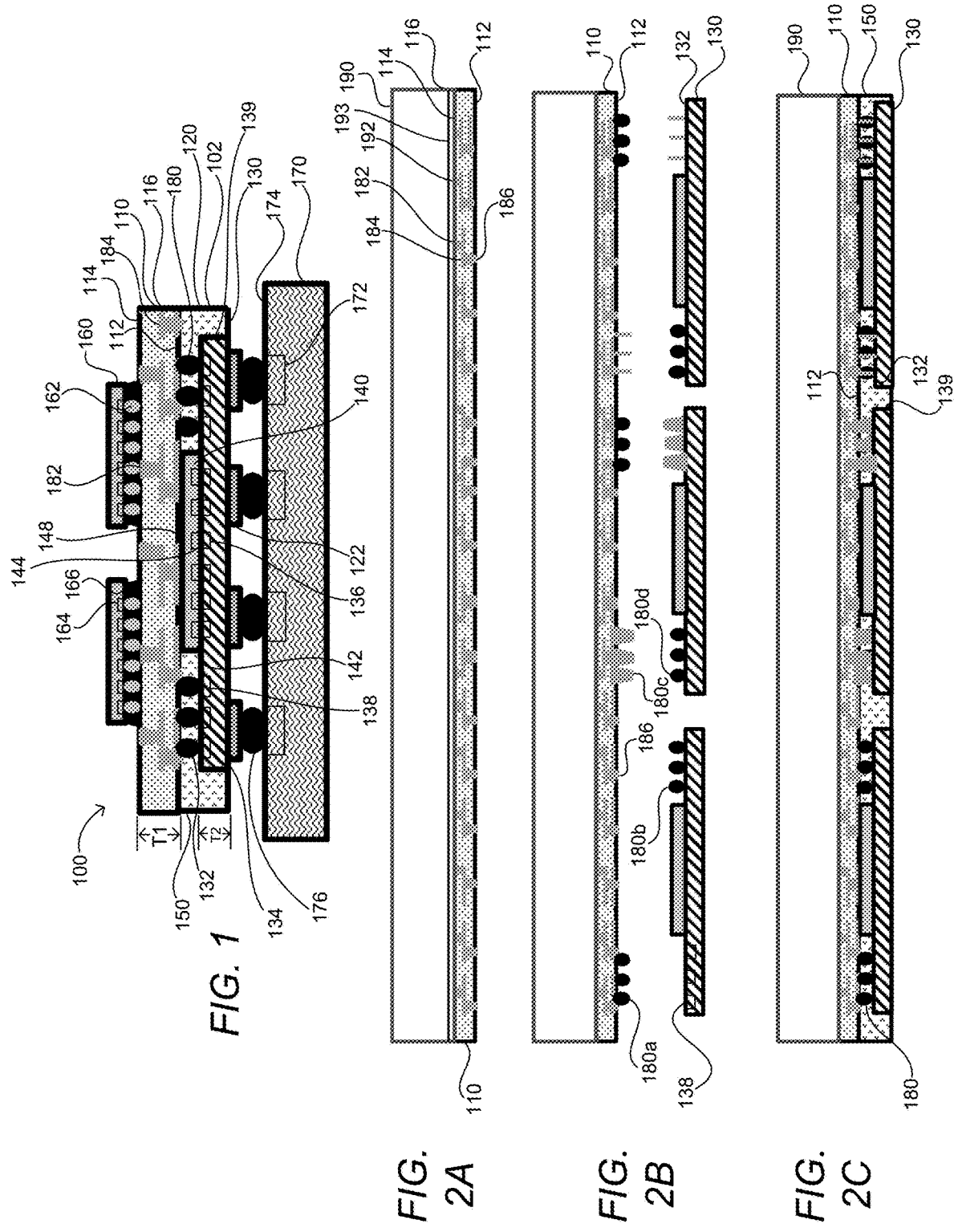

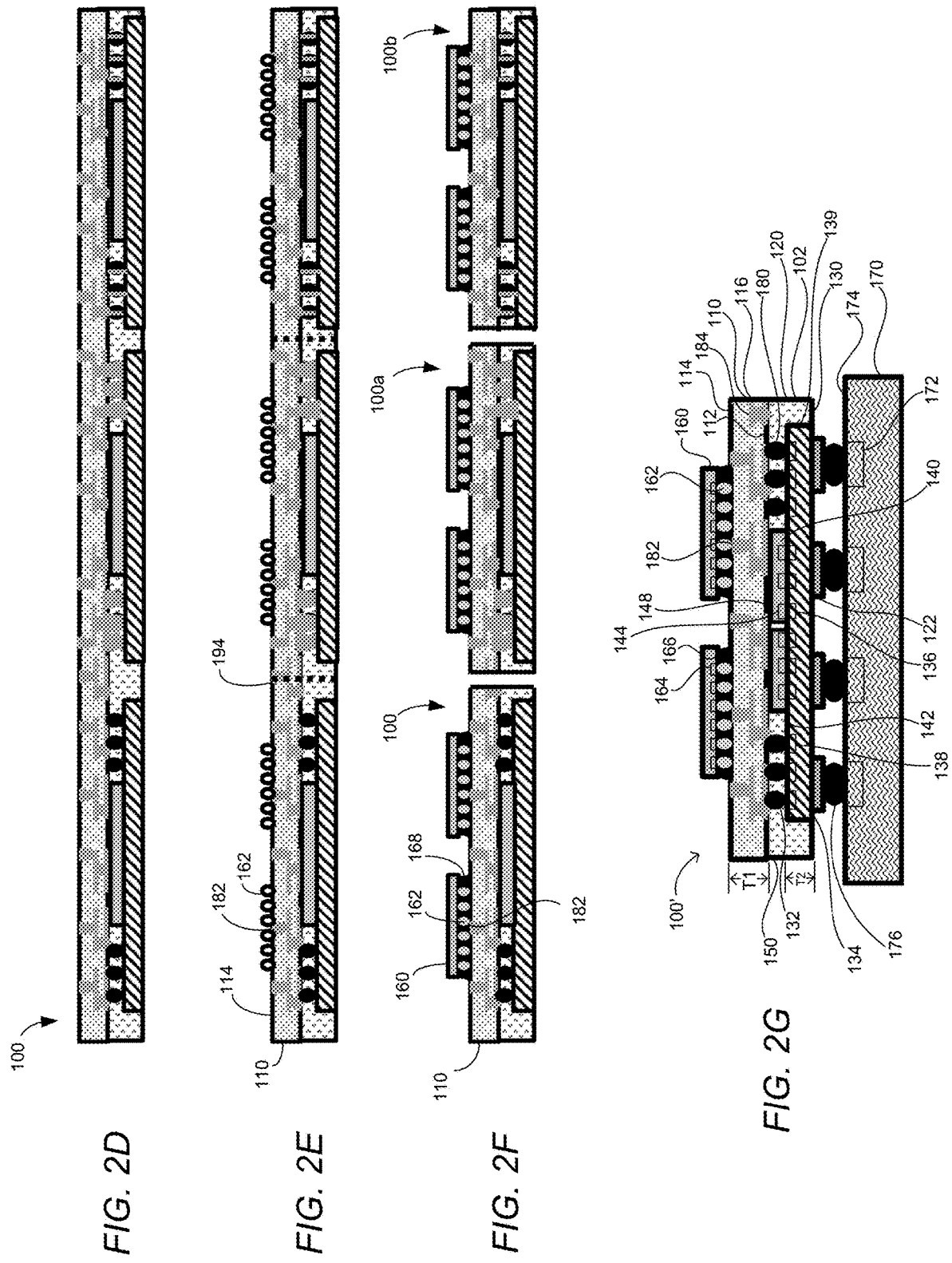

SSI POP

CROSS-REFERENCE TO RELATED APPLICATIONS

The present application is a divisional of U.S. patent application Ser. No. 14/958,190, filed Dec. 3, 2015, which claims the benefit of the filing date of U.S. Provisional Patent Application No. 62/159,136, filed May 8, 2015, the disclosures of which are hereby incorporated herein by reference.

BACKGROUND OF THE INVENTION

The present invention relates to microelectronic packaging and elements thereof and more specifically to an assembly for electrically interconnecting and packaging a plurality of microelectronic elements in a common package.

Multi-chip packages that incorporate silicon interposers can be used to provide high speed, high bandwidth or a high degree of parallel interconnections between multiple microelectronic elements arranged side by side above a surface of a common interposer. Silicon interposers are typically formed from a relatively thick wafer in which wiring patterns and contacts are fabricated in a thin layer of the silicon wafer and above the thin layer, after which the bulk of the wafer is ground down or otherwise discarded. As silicon wafers are almost exclusively processed using semiconductor processing equipment in clean rooms, such processing and the discarding of the unneeded bulk wafer can make silicon interposers more expensive and more difficult to fabricate than other types of circuit structures.

In addition, the horizontal area of such multi-chip packages can be large, and may constrain further miniaturization of a system such as smart phone, tablet, phablet or other handheld device, or personal computer in which the multi-chip package is incorporated. Further improvements in the structure and fabrication of multi-chip packages, as well as the horizontal area occupied thereby, would be desirable.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components that form the interconnections should not greatly increase the size of the assembly. Similar needs arise in other applications as, for example, in data servers such as those used in internet search engines, where increased performance and size reduction are needed.

Semiconductor chips containing memory storage arrays, particularly dynamic random access memory chips (DRAMs) and flash memory chips, are commonly packaged in single- or multiple-chip packages and assemblies. Each package has many electrical connections for carrying signals, power, and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds, which extend in both horizontal and vertical directions relative to the surface of the chip.

As manufacturers of smartphones, tablets, and other devices constantly seek increased performance and greater circuit density, the trend for these devices is to provide ever-greater functional capabilities in an amount of space on a circuit panel that may stay the same or may decrease over time. In light of the foregoing, certain improvements can be made in the structure of microelectronic packages and assemblies that comprise a microelectronic package having a memory controller function, or "controller package" as further defined herein. Such improvements may help reduce an amount of space of a circuit panel, e.g., a motherboard, occupied by the controller and memory packages when such controller and memory packages are mounted in close proximity to one another at non-overlapping areas of the circuit panel.

BRIEF SUMMARY OF THE INVENTION

An assembly can include a first microelectronic package and a circuit structure comprising a plurality of dielectric layers and electrically conductive features thereon. The first microelectronic package can include a substrate having a plurality of first contacts at a first or second surface thereof and a plurality of second contacts at the first surface thereof, and a first microelectronic element having a plurality of element contacts at a front surface thereof, the first contacts electrically coupled with the element contacts of the first microelectronic element. The circuit structure can have a first surface facing at least a portion of the first surface of the substrate with the first microelectronic element between the circuit structure and the substrate.

The circuit structure can have a maximum thickness of less than 50 microns in a direction normal to the first surface of the circuit structure. The electrically conductive features can include a plurality of bumps at the first surface of the circuit structure facing the second contacts of the substrate and joined thereto, and a plurality of circuit structure contacts at a second surface of the circuit structure opposite the first surface thereof configured for connection with contacts of a component external to the assembly. The electrically conductive features can include a plurality of traces coupling at least some of the bumps with the circuit structure contacts.

In one embodiment, the component external to the assembly can be a second microelectronic package having a second microelectronic element therein, and the contacts of the component can be terminals at a surface of the second microelectronic package electrically coupled with element contacts of the second microelectronic element. The assembly can also include the second microelectronic package, the terminals of the second microelectronic package facing at least some of the circuit structure contacts and joined thereto. In a particular example, the first microelectronic element can be an application processor, and the second microelectronic element can embody a greater number of active devices to provide memory storage array function than any other function.

In an exemplary embodiment, the component external to the assembly can be a second microelectronic element. The assembly can also include the second microelectronic element, the contacts of the second microelectronic element facing at least some of the circuit structure contacts and joined thereto. In one example, the assembly can also include a third microelectronic element spaced apart from the second microelectronic element in a direction parallel to the first surface of the circuit structure, contacts of the third microelectronic element facing at least some of the circuit structure contacts and joined thereto.

In a particular embodiment, the element contacts of the first microelectronic element can be electrically coupled with a first subset of the first contacts of the substrate, and the first microelectronic package can also include a second microelectronic element having a plurality of element contacts at a front surface thereof electrically coupled with a second subset of the first contacts of the substrate. In one embodiment, at least one of: the bumps, or connections between the bumps and the second contacts of the substrate can include a bond material. The assembly can also include an underfill mechanically reinforcing the connections between the bumps of the circuit structure and the second contacts. The underfill can have a composition different from a composition of the substrate, and different from a composition of the circuit structure.

In a particular example, the bumps can include extruded wire segments. The assembly can also include a compliant underfill disposed between the first surface of the substrate and the second surface of the circuit structure. The underfill can have a composition different from a composition of the substrate, and different from a composition of the circuit structure. In an exemplary embodiment, at least some of the traces can be disposed closer to the first surface of the circuit structure and can have maximum widths greater than maximum widths of the traces that are disposed closer to the second surface of the circuit structure.

In one example, at least some of the traces can have maximum widths less than two microns. In a particular embodiment, a system can include the assembly as described above and one or more other electronic components electrically connected with the assembly. In one embodiment, the system can also include a housing, the assembly and the one or more other electronic components being assembled with the housing.

A method of making an assembly can include forming a circuit structure mechanically coupled to a surface of a carrier, joining bumps of the circuit structure with a plurality of second contacts at a first surface of a substrate having a first microelectronic element mounted to first contacts of the substrate, the second contacts facing the bumps, and separating the circuit structure from the carrier.

The forming of the circuit structure can include forming a first dielectric layer mechanically coupled to the carrier and forming a plurality of circuit structure contacts and a plurality of conductive traces supported by the first dielectric layer, forming a second dielectric layer mechanically coupled with the first dielectric layer, and forming the bumps at a surface of the second dielectric layer opposite from a surface of the first dielectric layer that faces the carrier. At least some of the traces can have maximum widths less than two microns. The bumps can be electrically coupled with the circuit structure contacts through the traces. The circuit structure contacts can be configured for connection with corresponding contacts of a component external to the assembly.

In a particular example, the component external to the assembly can be a microelectronic package having a second microelectronic element therein, and the contacts of the component can be terminals at a surface of the microelectronic package electrically coupled with element contacts of the second microelectronic element. The method can also include joining at least some of the circuit structure contacts with the terminals of the microelectronic package. In an exemplary embodiment, the component external to the assembly can be a second microelectronic element. The method can also include joining at least some of the circuit structure contacts with the contacts of the second microelectronic element.

In one example, the method can also include connecting at least some of the circuit structure contacts with the corresponding contacts of the component external to the assembly. The carrier can provide support during formation of the first and second dielectric layers of the circuit structure thereon. The circuit structure can be separated from the carrier prior to the connecting. In a particular embodiment, a release layer can maintains the circuit structure atop the carrier during formation of the first and second dielectric layers, and the circuit structure can be separated from the carrier by releasing the release layer. In one embodiment, the circuit structure can be separated from the carrier by abrading the carrier.

In a particular example, the traces can be first traces, and the maximum widths of the first traces can be defined by no first traces having greater widths than two microns. The forming of the circuit structure can include forming second traces after forming the first traces. The second traces can be electrically coupled with the first traces. At least some of the second traces can have maximum widths larger than the maximum widths of the first traces. In an exemplary embodiment, the method can also include providing an encapsulant extending between the circuit structure and the substrate. A portion of the encapsulant can extend between the second surface of the circuit structure and an edge surface of the substrate.

In one example, the joining the bumps can be performed to unite the circuit structure with the substrate. The method can also include providing an underfill surrounding individual bumps of the assembly and contacting the first surface of the substrate and a surface of the circuit structure facing the substrate. In a particular embodiment, the substrate can be a first substrate. The method can also include joining the bumps of the circuit structure with a plurality of second contacts at a first surface of a second substrate having a second microelectronic element mounted to first contacts of the second substrate, the second contacts facing the bumps. The method can also include, after separating the circuit structure from the carrier, singulating the assembly into a first assembly including the first substrate and a second assembly including the second substrate.

BRIEF DESCRIPTION OF THE DRAWINGS

FIG. 1 depicts a side sectional view illustrating a multi-chip package in accordance with an embodiment of the invention.

FIGS. 2A-2F are side sectional views illustrating stages of fabrication in accordance with the embodiment depicted in FIG. 1.

FIGS. 2G and 2H depict side sectional views illustrating multi-chip packages in accordance with variations of the embodiment of FIG. 1.

DETAILED DESCRIPTION

Figure 2H:
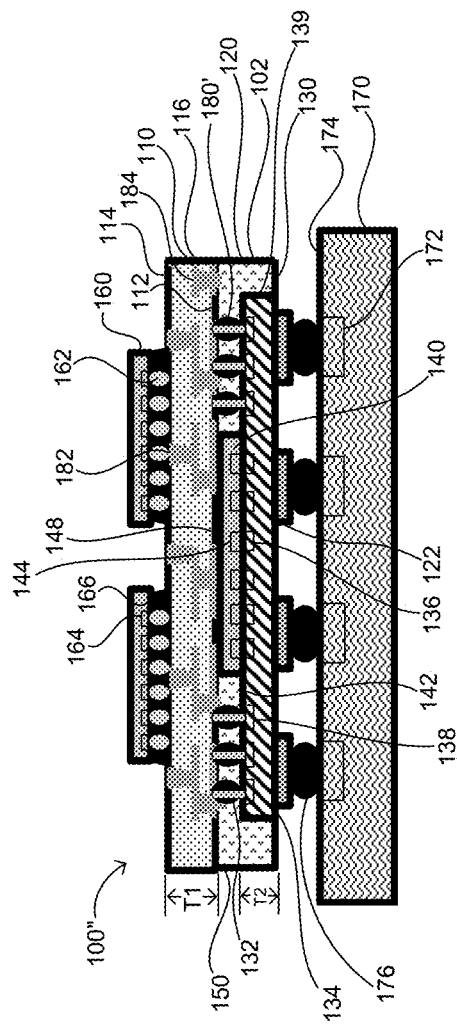

As used in this disclosure with reference to a dielectric element or other component, e.g., circuit structure, interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the substrate toward the surface of the component from outside the component. Thus, a terminal or other conductive element that is at a surface of a component may project from such surface; may be flush with such surface; or may be recessed relative to such surface in a hole or depression in the component.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature. As used herein, a statement that one surface or element is located at a "constant" height above or below another surface or element means constant within manufacturing tolerances, e.g., ±10% over the area of a completed single interconnection element.

As illustrated in FIG. 1, an assembly 100 can include a circuit structure 110 joined with a first microelectronic package 120. The circuit structure 110 can have a first surface 112 and a second surface 114 opposite from the first surface. The first microelectronic package 120 can have a substrate 130 defining a first surface 132 facing the first surface 112 of the circuit structure 110, a second surface 134 opposite from the first surface, and terminals 122 at the second surface. The first microelectronic package 120 can have a first microelectronic element 140 and an encapsulant 150 at least partially covering the first microelectronic element and the first surface 132 of the substrate 130.

The assembly 100 can be joined to and electrically interconnected with one or more second microelectronic elements 160 that can be mounted to the second surface 114 of the circuit structure 110. In one example, the first microelectronic element 140 can have a processor function, and the one or more second microelectronic elements 160 can have a memory function. For example, the first microelectronic element 140 can be an application processor such as a baseband processor. In one example, the second microelectronic elements 160 can include high-bandwidth memory chips. In a particular embodiment, the second microelectronic elements 160 can each embody a greater number of active devices to provide memory storage array function than any other function.

The assembly 100 can be joined to and electrically interconnected with a circuit panel 170, the terminals 122 of the assembly being electrically coupled to panel contacts 172 at a major surface 174 of the circuit panel by conductive bond material 176, for example, with the major surface of the circuit panel confronting the second surface of the substrate 130.

In FIG. 1, the directions parallel to the first and second 112, 114 of the circuit structure 110 are referred to herein as "horizontal" or "lateral" directions, whereas the directions perpendicular to the front and rear surfaces are referred to herein as upward or downward directions and are also referred to herein as the "vertical" directions. The directions referred to herein are in the frame of reference of the structures referred to. Thus, these directions may lie at any orientation to the normal or gravitational frame of reference.

The circuit structure 110 can comprise or can be made of a plurality of thin dielectric layers 116 stacked one atop another, and electrically conductive features thereon such as bumps 180 at the first surface 112, circuit structure contacts 182 at the second surface 114, and conductive traces 184 electrically coupling the bumps with the circuit structure contacts. In one example, the circuit structure 110 can have a maximum thickness T1 of less than 50 microns in a direction normal to the first surface 112 of the circuit structure. In particular embodiment, the circuit structure 110 can have a maximum thickness T1 of less than 10 microns in a direction normal to the first surface 112 of the circuit structure.

With the circuit structure 110 comprising or being made of dielectric layers rather than semiconductor material, and omitting semiconductor material as a primary material supporting the electrically conductive features of the circuit structure, advantages for cost of the circuit structure, simplified fabrication, and other advantages can be obtained as described below.

The dielectric material of the dielectric layers 116 can be a material that can be deposited and patterned to form structures that support metallization thereon at a pitch of less than 5 microns, less than 2 microns, less than 1 micron, or at least as low as 0.2 microns. In one embodiment, each dielectric layer 116 can be planarized before depositing the next dielectric layer.

The dielectric layers 116 may be made of silicon dioxide or polyamide, for example. In particular examples, the dielectric material can be a photosensitive polymer, e.g., benzocyclobutene ("BCB") based material, or other photosensitive material. In particular examples, the dielectric material can be deposited by chemical vapor deposition ("CVD"), spray coating, spin coating, roller coating, dipping, or the like. In particular examples, a self-planarizing dielectric material can be deposited to form one or more of the dielectric layers, such material having a tendency to form a flattened or flat upper surface as compared to topography that may be present in features underlying the upper surface.

As further seen in FIG. 1, the plurality of circuit structure contacts 182 at the second surface 114 of the circuit structure 110 can be electrically coupled with the bumps 180 through the electrically conductive features of the circuit structure that include traces 184. The electrically conductive features of the circuit structure 110 can provide electrical interconnection between the second microelectronic elements 160 and the assembly 100. The electrically conductive features of the circuit structure 110 also can provide chip-to-chip electrical interconnectivity among the second microelectronic elements 160.

The electrically conductive features including the bumps 180, the circuit structure contacts 182, and the traces 184 can be made of an electrically conductive material, for example, a metal such as copper, gold, or the like. In one example, the bumps 180 can comprise an electrically conductive bond material such as solder, tin, indium, gold, a eutectic composition or combination thereof, another joining material such as a conductive paste or a conductive adhesive, and/or an electrically conductive composition that includes a metal component such as metal particles or flakes and a polymeric component. Such bumps can be deposited onto portions of the traces 184.

In a particular embodiment, the conductive bond material of the bumps 180 can include an electrically conductive matrix material such as described in U.S. patent application Ser. Nos. 13/155,719 and 13/158,797, the disclosures of which are hereby incorporated herein by reference. In a particular embodiment, the conductive bond material of the bumps 180 can have a similar structure or be formed in a manner as described therein. In some examples, suitable materials for the conductive bond material of the bumps 180 can include polymers filled with conductive material in particle form such as metal-filled polymers, including, for example, metal-filled epoxy, metal-filled thermosetting polymers, metal-filled thermoplastic polymers, or electrically conductive inks.

Alternatively, the bumps 180 can comprise posts or pins, or stud bumps or bond via interconnects each formed of extruded wire, such bumps projecting to heights thereof from the first surface 112. The bumps 180 can be joined with second contacts 138 at the first surface 132 of the substrate 130 at such heights with an electrically conductive bond material such as those described above, for example.

As shown in FIG. 1, the circuit structure contacts 182 of the circuit structure 110 can be configured for flip-chip connection with a plurality of element contacts 164 at faces 166 of one or more second microelectronic elements 160 overlying different portions of an area of the second surface 114 of the circuit structure 110. Stated another way, the circuit structure contacts 182 can be configured to be joined with the corresponding element contacts 164, as through electrically conductive bumps 162, in a state in which the structure contacts of the assembly 100 are juxtaposed with, i.e., face the corresponding element contacts 164 of the microelectronic elements 160. Alternatively, the circuit structure contacts 182 can be configured for flip-chip connection with a plurality of terminals of one or more microelectronic packages, as will be described below with reference to FIG. 3.

The traces 184 on the circuit structure 110 may have their smallest pitch and their smallest line and space dimensions at positions that are closer to the second surface 114 of the circuit structure than the first surface 112. Thus, traces 184 of the circuit structure 110 that are disposed closer to the first surface 112 may have maximum widths greater than maximum widths of the conductive traces that are disposed closer to the second surface 114. At least some of the traces 184 can have maximum widths less than five microns, less than 2 microns, less than 1 micron, or at least as low as 0.2 microns.

Alternatively, the traces 184 on the circuit structure 110 may have their smallest pitch and their smallest line and space dimensions at positions that are closer to the first surface 112 of the circuit structure than the second surface 114. In one example, the traces 184 on the circuit structure 110 may have approximately equal pitch and their smallest line and space dimensions at positions close to both of the first and second surfaces 112, 114.

The first microelectronic package 120 can have a substrate 130 defining first and second opposite surfaces 132, 134. The substrate 130 in some cases can have a thickness T2 of 1 to 2 millimeters in a direction normal to the front surface 132. The substrate 130 can have a single-metal layer or multiple-metal layer structure. In one embodiment, the substrate 130 can have layers made of an organic material or a polymer-based material, for example.

In a particular example, the supporting dielectric structure can be reinforced by glass or semiconductor particles, rods or other such structure embedded within the dielectric material, which can be of or include any or all of epoxies, thermosetting plastics or thermoplastics, polyimide, polycarbonate, polytetra-fluoroethylene ("PTFE"), polymethyl methacrylate ("PMMA"), low-K dielectric materials, e.g., porous dielectric materials, low glasses, ceramics, or other materials. In particular examples, the substrate 130 can be of FR-4 or BT resin construction.

The substrate 130 can have electrically conductive features thereon. As shown in FIG. 1, such electrically conductive features can be first contacts 136 and second contacts 138 at the first surface 132 of the substrate 130, terminals 122 at the second surface 134, and conductive structure such as traces and vias (not shown) providing an electrical connection between the first and second contacts and the terminals.

The first microelectronic package 120 can have one or more first microelectronic elements 140 mounted to the substrate 130. As shown in FIG. 1, the first microelectronic element 140 is flip-chip mounted to the substrate 130, with the front surface 142 of the first microelectronic element confronting the first surface 132 of the substrate. Element contacts 144 at the front surface 142 are joined to and electrically coupled with the first contacts 136 of the substrate 130.

Although the first microelectronic package 120 is shown in FIG. 1 as having a single first microelectronic element 140 mounted to the first surface 132 of the substrate 130, that need not be the case. In particular examples (e.g., the assembly 100' shown in FIG. 2G), the first microelectronic package 120 can have two or more first microelectronic elements 140, and such first microelectronic elements may be disposed adjacent to one another overlying the first surface 132 of the substrate 130, stacked one atop another overlying the first surface of the substrate, or stacked in an partially-overlapping configuration in which a first one of the first microelectronic elements is disposed adjacent the substrate and a second one of the first microelectronic elements partially overlies the first one of the first microelectronic elements (e.g., similar to the partially-overlapping configuration of the microelectronic elements 260 shown in FIG. 3).

Although the first microelectronic element 140 is shown in FIG. 1 as being face-down flip-chip mounted to the first surface 132 of the substrate 130, that need not be the case. In one example, one or more first microelectronic elements 140 can be face-down wire-bonded to the substrate 130, with the element contacts 144 being electrically connected to first contacts 136 at the second surface 134 by wire bonds extending through a bond window of the substrate.

In a particular embodiment, a rear surface 148 of one or more first microelectronic elements 140 can be mounted to the first surface 132 of the substrate 130 by an adhesive, for example, and the front surface 142 bearing the element contacts 144 can be electrically connected to the bumps 180 at the first surface 112 of the circuit structure 110. In other examples, the first microelectronic package 120 can include a plurality of first microelectronic elements 140 mounted to and electrically connected with conductive elements of the substrate 130.

In a particular example, the element contacts 144 of a first one of the first microelectronic elements 140 can be electrically coupled with a first subset of the first contacts 136 of the substrate 130, and a second one of the first microelectronic elements can be electrically coupled with a second subset of the first contacts of the substrate.

In one example (not shown), one or more of the microelectronic elements 160 having contact-bearing faces at a greater height from the second surface 114 than one or more others of the microelectronic elements, can partially overlap the one or more other microelectronic elements. For example, the microelectronic elements can be arranged and interconnected with the circuit structure in a manner such as seen in commonly-owned U.S. Pat. No. 8,952,516 to Zohni et al., the disclosure of which is incorporated by reference herein.

The first microelectronic package 120 can have an encapsulant 150 at least partially covering the first microelectronic element and the first surface 132 of the substrate 130. The encapsulant 150 can contact peripheral edge surfaces 139 of the substrate 130. The encapsulant may also flow between the facing first surfaces 112 and 132 of the circuit structure 110 and the substrate 130, reinforcing the connections therebetween through the bumps 180.

Alternatively, a separate encapsulant can surround individual bumps 180 and can fill spaces between the first surface 112 of the circuit structure and the first surface 132 of the substrate 130. Such encapsulant can be an underfill material for mechanically reinforcing connections between the circuit structure and the dielectric element through the bumps 180.

The material of the encapsulant 150 most typically has a composition different from the composition of the dielectric layers of the circuit structure and the dielectric element. In particular embodiments, the encapsulant material is an overmold or potting compound. Such compound can provide stiffness to the assembly to withstand internal differential thermal expansion within the assembly 100. The compound may in some cases provide protection from shorting and moisture and/or water resistance. As seen in FIG. 1, the encapsulant can define edge surfaces 102 of the assembly 100 that are parallel to the peripheral edge surfaces 139 of the substrate 130.

The assembly 100 can be joined to one or more second microelectronic elements 160 that can be mounted to the second surface 114 of the circuit structure 110. As seen in FIG. 1, the microelectronic elements 160 can be spaced apart from one another in one or more directions parallel to the second surface 114 of the circuit structure 110, such that the front surfaces 166 of adjacent microelectronic elements do not overlap and there is some space, which can be small, separating the closest edges of adjacent microelectronic elements from one another.

However, in another example (not shown), one or more of the microelectronic elements 160 having contact-bearing faces at a greater height from the second surface 114 than one or more others of the microelectronic elements, can partially overlap the one or more other microelectronic elements. For example, the microelectronic elements can be arranged and interconnected with the circuit structure in a manner such as seen in commonly-owned U.S. Pat. No. 8,952,516 to Zohni et al., the disclosure of which is incorporated by reference herein.

In some examples, one or more electronic components, which may be passive components such as capacitors, resistors or inductors, or active components such as voltage regulators or buffer elements, can be provided in the assembly 100. For example, one or more of such passive and/or active components can be mounted to the first surface 112 or the second surface 114 of the circuit structure 100, and/or can be disposed underlying the first surface or the second surface of the circuit structure. Such components can be mounted to the first surface 132 and/or the second surface 134 of the substrate 130, and/or can be embedded in an encapsulant 150 that occupies a volume of the assembly 100 below the first surface 112 of the circuit structure 110.

A method of fabrication will now be described in accordance with FIGS. 2A-2F. Referring to FIG. 2A, the circuit structure 110 can be fabricated by depositing a dielectric layer 116 and electrically conductive features such as the substrate contacts 182 and the conductive traces 184 over a surface 192 of a carrier 190 on which a release layer 193 may be provided.

The carrier 190 typically is a flat plate-like element of ceramic, glass, or semiconductor composition, or in some cases, an overmold material. The carrier 190 may have a coefficient of thermal expansion of less than 12 parts per million per degree Celsius ("ppm/° C.") in a horizontal plane of the carrier parallel to the surface 192.

The process can be performed so as to form a plurality of dielectric layers 116 and electrically conductive features such as described above with reference to FIG. 1. In one example, features, e.g., conductive traces 184 having finest pitch or finest line and space widths (e.g., less than 5 microns), can be formed first and closest to the surface 192 of the carrier 190, after which conductive traces having pitch or line and space widths larger than the finest pitch and line/space widths are formed.

The first one of the dielectric layers 116 to be formed can include the substrate contacts 182 at the second surface 114 of the circuit structure 110. The last one of the dielectric layers 116 to be formed can include conductive elements 186 at the first surface 112 of the circuit structure 110. The conductive elements 186 can be electrically coupled to the substrate contacts 182 by the conductive traces 184. The conductive elements 186 can be configured to be joined with the bumps 180.

Next, as shown in FIG. 2B, the bumps 180, e.g., masses of bonding material, cylindrical or frusto-conical posts or pins, stud bumps, bumps of extruded wire (e.g., bumps 180' of assembly 100" shown in FIG. 2H), or the like, can be formed extending from the first surface 112 of the circuit structure 110, and/or extending from the first surface 132 of the substrate 130. The first microelectronic element 140 can be joined with the substrate 130 before the substrate is joined with the circuit structure 110.

In one example, the bumps 180 can be formed on only the first surface 112 of the circuit structure 110 (e.g., the bumps 180a), or only the first surface 132 of the substrate 130 (e.g., the bumps 180b). In another example, masses of bond material can be formed on one of the first surfaces 112, 132 (e.g., the bumps 180c), while conductive elements such as cylindrical or frusto-conical posts or pins, stud bumps, bumps of extruded wire (e.g., the bumps 180' of the assembly 100" shown in FIG. 2H), or the like can be formed on the other one of the first surfaces (e.g., the bumps 180d).

Then, as can be seen in FIG. 2C, the substrates 130 can be united with the circuit structure 110 such that the bumps 180a are joined with corresponding second contacts 138 of the substrate, and/or the bumps 180b are joined with corresponding conductive elements 186 of the circuit structure, and/or the bumps 180c at the first surface 112 of the circuit structure are joined with the bumps 180d at the first surface 132 of the substrate.

The encapsulant 150 can then be introduced into spaces below the first surface 112 of the circuit structure 110, the encapsulant filling spaces between adjacent edge surfaces 139 of the substrates 130. Either a separate underfill, or optionally, the same encapsulant 150, can be applied to the space surrounding the bumps 180 between the circuit structure and the substrates.

Referring to FIG. 2D, the carrier 190 (FIG. 2C) can then be separated from an in process assembly 100' that may include an in-process circuit structure having dimensions greater than the dimensions of an individual assembly 100 seen in FIG. 1. In particular embodiments, the carrier can be separated from the in-process assembly 100' by mechanical or chemically-assisted dissolution of a release layer disposed therebetween. Alternatively, the carrier can be abraded from a side opposite the in-process assembly 100' until the in-process structure is released therefrom. Thereafter, as shown in FIG. 2E, bumps 162 can be applied to the substrate contacts 182 at the second surface 114 of the circuit structure 110.

In time, as shown in FIG. 2F, the second microelectronic elements 160 (or the second microelectronic packages shown in FIG. 3) can be united with the substrate contacts 182 of the circuit structure 110 by the bumps 162 extending between the microelectronic elements and the substrate contacts, and an encapsulant or underfill 168 can then be introduced into spaces between the microelectronic elements and the second surface 114 of the circuit structure. Either before or after assembly of the second microelectronic elements 160 thereon, the in-process assembly 100' can be severed along dicing lanes 194 (FIG. 2E) to singulate the in-process assembly into individual assemblies 100, 100a, and 100b.

Referring again to FIG. 1, the assembly 100 can be attached to a circuit panel 170 or another external component. The terminals 122 of the assembly can be electrically coupled to the panel contacts 172 by a conductive bond material 176, for example, with the major surface 174 of the circuit panel confronting the second surface 134 of the substrate 130.

An alternative method of forming the bumps 162 at a dielectric layer deposited onto the surface 192 of the carrier 190, before forming the circuit structure 110, is shown and described in the co-owned and co-pending application "Reversed Build-Up Substrate for 2.5D," filed on even date herewith, the disclosure of which is hereby incorporated by reference herein.

Figure 3:
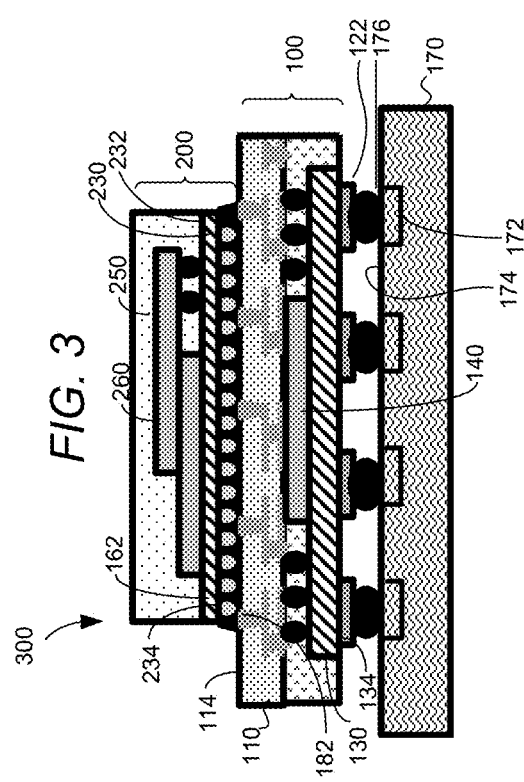
FIG. 3 depicts a side sectional view illustrating a multi-chip package in accordance with a variation of the embodiment of FIG. 1.

FIG. 3 shows a package-on-package ("PoP") assembly 300 that includes the assembly 100 of FIG. 1, in accordance with a variation of the embodiment of FIG. 1. Instead of having second microelectronic elements 160 attached to the second surface 114 of the circuit structure 110, a second microelectronic package 200 is attached to the second surface of the circuit structure.

As shown in FIG. 3, the second microelectronic package 200 can include one or more second microelectronic elements 260 mounted to a first surface 232 of a second substrate 230, and an encapsulant 250 at least partially covering the second microelectronic elements. The bumps 162 described above can electrically couple the substrate contacts 182 with corresponding terminals at a second surface 234 of the substrate 230 that confronts the second surface 114 of the circuit structure 110.

In the example shown, the second microelectronic elements 260 are flip-chip mounted to the substrate 230 in a partially-overlapping configuration. In other examples, the one or more second microelectronic elements 260 can be attached to the substrate 230 and arranged relative to the substrate 230 in various configurations including those described above with reference to the first microelectronic elements 140 and the second microelectronic elements 160 (e.g., face-down flip-chip mounted, face-down wire-bonded, face-up wire-bonded, face-down partially-overlapping, etc.).

In one example, the first microelectronic element 140 can have a processor function, and the one or more second microelectronic elements 260 can have a memory function. For example, the first microelectronic element 140 can be an application processor such as a baseband processor. In one example, the second microelectronic package 200 can be a memory package, and the second microelectronic elements 260 can include high-bandwidth memory chips. In a particular embodiment, the second microelectronic elements 260 can each embody a greater number of active devices to provide memory storage array function than any other function.

The PoP assembly 300 can be joined to and electrically interconnected with a circuit panel 170, the terminals 122 of the assembly 100 being electrically coupled to panel contacts 172 at a major surface 174 of the circuit panel by conductive bond material 176, for example, with the major surface of the circuit panel confronting the second surface 134 of the substrate 130.

Figure 4:
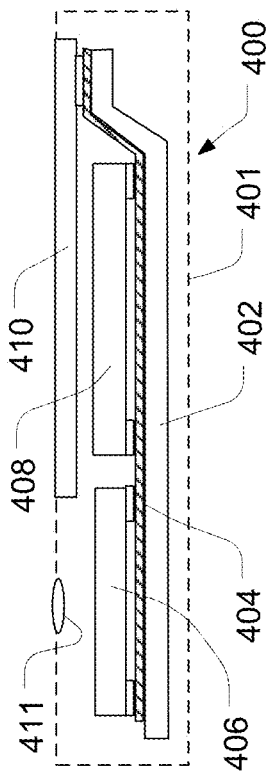
FIG. 4 is a schematic depiction of a system according to one embodiment of the invention.

The interconnection elements described above with reference to FIGS. 1 through 3 above can be utilized in construction of diverse electronic systems, such as the system 400 shown in FIG. 4. For example, the system 400 in accordance with a further embodiment of the invention includes a plurality of modules or components 406 such as the assemblies 100 or 300 described above, in conjunction with other electronic components 408, 410 and 411.

In the exemplary system 400 shown, the system can include a circuit panel, motherboard, or riser panel 402 such as a flexible printed circuit board, and the circuit panel can include numerous conductors 404, of which only one is depicted in FIG. 4, interconnecting the modules or components 406, 408, 410 with one another. Such a circuit panel 402 can transport signals to and from each of the interconnection elements, microelectronic packages and/or microelectronic assemblies included in the system 400. However, this is merely exemplary; any suitable structure for making electrical connections between the modules or components 406 can be used.

In the example depicted in FIG. 4, the component 408 is a semiconductor chip and component 410 is a display screen, but any other components can be used in the system 400. Of course, although only two additional components 408 and 411 are depicted in FIG. 4 for clarity of illustration, the system 400 can include any number of such components.

Modules or components 406 and components 408 and 411 can be mounted in a common housing 401, schematically depicted in broken lines, and can be electrically interconnected with one another as necessary to form the desired circuit. The housing 401 is depicted as a portable housing of the type usable, for example, in a cellular telephone or personal digital assistant, and screen 410 can be exposed at the surface of the housing. In embodiments where a structure 406 includes a light-sensitive element such as an imaging chip, a lens 411 or other optical device also can be provided for routing light to the structure. Again, the simplified system shown in FIG. 4 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of making an assembly, comprising:
   forming a circuit structure mechanically coupled to a surface of a carrier, the forming including:
      forming a first dielectric layer mechanically coupled to the carrier and forming a plurality of circuit structure contacts and a plurality of conductive traces supported by the first dielectric layer, at least some of the plurality of conductive traces having maximum widths less than two microns,
      forming a second dielectric layer mechanically coupled with the first dielectric layer, wherein the carrier provides support during formation of the first and second dielectric layers of the circuit structure thereon, and
      forming bumps at a surface of the second dielectric layer opposite from a surface of the first dielectric layer that faces the carrier, the bumps being electrically coupled with the plurality of circuit structure contacts through the plurality of conductive traces;
   joining the bumps of the circuit structure with a plurality of second contacts at a first surface of a substrate having a first microelectronic element mounted to first contacts of the substrate, the second contacts facing the bumps;
   providing an encapsulant extending between the circuit structure and the substrate, wherein a portion of the encapsulant extends between a second surface of the circuit structure and an edge surface of the substrate; and
   separating the circuit structure from the carrier,
   wherein the plurality of circuit structure contacts are configured for connection with corresponding contacts of a component external to the assembly, and
   wherein the joining the bumps is performed to unite the circuit structure with the substrate, the method further comprising providing an underfill surrounding and mechanically reinforcing individual bumps of the assembly and contacting the first surface of the substrate and a surface of the circuit structure facing the substrate, the underfill being separate from the encapsulant, the underfill having a composition different from a composition of the substrate, and different from a composition of the circuit structure.

2. The method as claimed in claim 1, wherein the component external to the assembly is a microelectronic package having a second microelectronic element therein, and the corresponding contacts of the component are terminals at a surface of the microelectronic package electrically coupled with element contacts of the second microelectronic element,
   the method further comprising joining at least some of the plurality of circuit structure contacts with the terminals of the microelectronic package.

3. The method as claimed in claim 1, wherein the component external to the assembly is a second microelectronic element, the method further comprising joining at least some of the plurality of circuit structure contacts with element contacts of the second microelectronic element.

4. The method as claimed in claim 1, wherein the plurality of conductive traces are first traces, and the maximum widths of the first traces are defined by no first traces having greater widths than two microns, and the forming of the circuit structure includes forming second traces after forming the first traces, the second traces electrically coupled with the first traces, and at least some of the second traces having maximum widths larger than the maximum widths of the first traces.

5. The method as claimed in claim 1, wherein the substrate is a first substrate, the method further comprising:
   joining the bumps of the circuit structure with a plurality of second contacts at a first surface of a second substrate having a second microelectronic element mounted to first contacts of the second substrate, the second contacts facing the bumps; and
   after separating the circuit structure from the carrier, singulating the assembly into a first assembly including the first substrate and a second assembly including the second substrate.

6. A method of making an assembly, comprising:
   forming a circuit structure mechanically coupled to a surface of a carrier, the forming including:
      forming a first dielectric layer mechanically coupled to the carrier and forming a plurality of circuit structure contacts and a plurality of conductive traces supported by the first dielectric layer, at least some of the plurality of conductive traces having maximum widths less than two microns,
      forming a second dielectric layer mechanically coupled with the first dielectric layer, and
      forming bumps at a surface of the second dielectric layer opposite from a surface of the first dielectric layer that faces the carrier, the bumps being electrically coupled with the plurality of circuit structure contacts through the plurality of conductive traces;
   joining the bumps of the circuit structure with a plurality of second contacts at a first surface of a substrate having a first microelectronic element mounted to first contacts of the substrate, the second contacts facing the bumps;
   providing an encapsulant extending between the circuit structure and the substrate, wherein a portion of the encapsulant extends between a second surface of the circuit structure and an edge surface of the substrate; and
   separating the circuit structure from the carrier,
   wherein the plurality of circuit structure contacts are configured for connection with corresponding contacts of a component external to the assembly,
   further comprising connecting at least some of the circuit structure contacts with the corresponding contacts of the component external to the assembly, wherein the carrier provides support during formation of the first and second dielectric layers of the circuit structure thereon, and the circuit structure is separated from the carrier prior to the connecting,
   wherein the joining the bumps is performed to unite the circuit structure with the substrate, the method further comprising providing an underfill surrounding and mechanically reinforcing individual bumps of the assembly and contacting the first surface of the substrate and a surface of the circuit structure facing the substrate, the underfill being separate from the encapsulant, the underfill having a composition different from a composition of the substrate, and different from a composition of the circuit structure.

7. The method as claimed in claim 6, wherein a release layer maintains the circuit structure atop the carrier during formation of the first and second dielectric layers, and the circuit structure is separated from the carrier by releasing the release layer.

8. The method as claimed in claim 6, wherein the circuit structure is separated from the carrier by abrading the carrier.

* * * * *